US010026416B2

(12) United States Patent
Takasu et al.

(10) Patent No.: US 10,026,416 B2
(45) Date of Patent: Jul. 17, 2018

(54) AUDIO SYSTEM, AUDIO DEVICE, MOBILE TERMINAL DEVICE AND AUDIO SIGNAL CONTROL METHOD

(71) Applicant: D & M HOLDINGS INC., Kanagawa (JP)

(72) Inventors: Yasuo Takasu, Kanagawa (JP); Hiroshi Fukushima, Kanagawa (JP)

(73) Assignee: D&M Holdings, Inc., Kanagawa (JP)

( * ) Notice: Subject to any disclaimer, the term of this patent is extended or adjusted under 35 U.S.C. 154(b) by 0 days.

(21) Appl. No.: 15/317,747

(22) PCT Filed: Mar. 31, 2015

(86) PCT No.: PCT/JP2015/060045
§ 371 (c)(1),
(2) Date: Dec. 9, 2016

(87) PCT Pub. No.: WO2015/190160
PCT Pub. Date: Dec. 17, 2015

(65) Prior Publication Data

US 2017/0117003 A1 Apr. 27, 2017

(30) Foreign Application Priority Data

Jun. 10, 2014 (JP) ................................ 2014-119512
Mar. 11, 2015 (JP) ................................ 2015-047932

(51) Int. Cl.

| | |
|---|---|
| ***H03G 3/00*** | (2006.01) |
| ***G10L 21/034*** | (2013.01) |
| ***G10L 21/02*** | (2013.01) |

(52) U.S. Cl.
CPC ........ *G10L 21/034* (2013.01); *G10L 21/0205* (2013.01); *H03G 3/002* (2013.01)

(58) Field of Classification Search
USPC ....... 381/26, 28, 91, 95, 104, 107, 109, 122, 381/311
See application file for complete search history.

(56) References Cited

FOREIGN PATENT DOCUMENTS

| | | |
|---|---|---|
| JP | 10-234099 A | 10/2000 |
| JP | 2011-24046 A | 2/2011 |

(Continued)

*Primary Examiner* — Yosef K Laekemariam
(74) *Attorney, Agent, or Firm* — Peter A. Nieves; Sheehan Phinney Bass & Green PA

(57) ABSTRACT

Provided is an audio system in which an audio signal to be heard can be automatically set to an appropriate volume or sound quality. The audio system is provided with: a mobile terminal device provided with a microphone unit that collects surrounding sound waves, and a transmission unit that, on the basis of the sound waves collected by the microphone unit, sets the volume or sound quality of an audio signal to be amplified by an audio device, and transmits the set audio signal volume or sound quality information to the audio device; and an audio device provided with an amplification unit that amplifies the audio signal, a control unit that adjusts the audio signal volume or sound quality by means of the amplifier, and a receiving unit that receives the audio signal volume or sound quality setting information from the mobile terminal device. The control unit controls the amplification unit so as to adjust the audio signal volume or sound quality on the basis of the audio signal volume or sound quality setting information received by the receiving unit.

2 Claims, 4 Drawing Sheets

(56) References Cited

FOREIGN PATENT DOCUMENTS

| | | | | |
|---|---|---|---|---|
| JP | 2011024046 | * | 2/2011 | ............... H04Q 9/00 |
| JP | 2013-216427 A | | 10/2013 | |
| JP | 2013216427 | * | 10/2013 | ............... B66B 3/00 |
| WO | WO 2005011111 | * | 3/2005 | ............... H03G 3/32 |

* cited by examiner

AUDIO SYSTEM, AUDIO DEVICE, MOBILE TERMINAL DEVICE AND AUDIO SIGNAL CONTROL METHOD

CROSS REFERENCE TO RELATED APPLICATIONS

This application is a national phase entry, under 35 U.S.C. 371, of international application no. PCT/JP2015/060045, entitled AUDIO SYSTEM, AUDIO DEVICE, MOBILE. TERMINAL DEVICE AND AUDIO SIGNAL CONTROL METHOD, which was filed on Mar. 31, 2015. This application also claims priority, under 35 U.S.C. 119, to Japanese patent application no. 2014-119512, which was filed on Jun. 10, 2014, and to Japanese patent application no. 2015-047932, which was filed on Mar. 11, 2015, The disclosure of each prior application is incorporated herein by reference in its entirety.

TECHNICAL FIELD

The present invention relates to: an audio system including an audio device configured to amplify and output an audio signal and a mobile terminal device configured to set volume or sound quality of the audio signal output by the audio device via a wireless network; an audio device; a mobile terminal device; and an audio signal control method.

BACKGROUND ART

Currently, there is known an audio device configured to: receive an audio signal from a reproduction device configured to reproduce an audio signal via a wireless network through use of a wireless network system; and amplify and output the received audio signal (see, for example, PTL 1). In recent years, there is also known an audio system including such an audio device as described above and a mobile terminal device, e.g., a cellular phone. In the above-mentioned audio system, the mobile terminal device and the audio device are connected to each other through a wireless network, and the audio device receives an audio signal transmitted from the mobile terminal device, amplifies the audio signal, and outputs the audio signal from a speaker. With such a related-art audio system, adjustment of volume or selection of a song of the audio signal output by the audio device can be arbitrarily changed remotely through operation of the mobile terminal device.

Such an audio system configured to transmit and receive the audio signal through the wireless network system does not require a reproduction device and a speaker device to be connected to each other through a signal cable unlike the related art. Therefore, there is no need to fix an installation place of the audio device, and a user is allowed to change the installation place of the audio device freely depending on an installation position and a listening position that are desired by the user, and to arbitrarily set the volume and the selection of the song of the audio signal output from the audio device by operating the mobile terminal device at a place distant from the audio device. Thus, the use can enjoy the audio signal output from the audio device.

CITATION LIST

Patent Literature

[PTL 1] JP 10-234099 A

SUMMARY OF INVENTION

Technical Problem

In an audio system configured to transmit and receive an audio signal through use of a wireless network as described above, when a user attempts to listen to the audio signal after changing an installation place of an audio device, surrounding environmental sound differs depending on a place where the audio device is installed. For example, in an exemplary case where the user desires to listen to the audio signal in a kitchen after changing the installation place of the audio device, which has been installed in a living room located in an indoor place, to the kitchen, when the user listens to the audio signal at the same volume as when the audio device was installed in the living room, the surrounding environmental sound, e.g., operation sound of a ventilating fan and a refrigerator in the kitchen, increases to a higher level than in the living room. Therefore, the audio signal may become harder to listen to depending on the surrounding environmental sound even when the user listens to the audio signal at the same volume as when the audio device was installed in the living room. In such a case, the user needs to adjust the volume of the audio signal to be output from the audio device every time the place where the audio device is installed is changed, and volume adjustment work is felt extremely burdensome.

In another case where the audio system including those devices is used to listen to the audio signal in a room, when the user desires to listen to music clearly, the user may carelessly increase the volume of the audio signal output from the audio device from time to time, and the audio signal at high volume may leak outdoors from the room as noise, which may trouble neighbors. Thus, with the related-art audio system, the installation place of the audio device can be easily changed, while there is a fear that the user may forget to confirm an outdoor environment of the room where the audio device is installed, and the sound of the audio signal may be more liable to leak outdoors.

The present invention has an object to provide an audio system capable of setting an audio signal, being listened to automatically to appropriate volume or sound quality. The audio system includes an audio device configured to amplify and output an audio signal and a mobile terminal device configured to set the volume or sound quality of the audio signal output by the audio device via a wireless network.

Solution to Problem

According to one embodiment of the present invention, there is provided an audio system, including: one or more audio devices each configured to amplify and output an audio signal; and a mobile terminal device configured to set volume or sound quality of the audio signal output by each of the one or more audio devices via a wireless network, in which: the mobile terminal device includes: a microphone unit configured to collect a surrounding sound wave; and a transmission unit configured to set volume or sound quality of the audio signal to be amplified by each of the one or more audio devices based, on the surrounding sound wave collected by the microphone unit, and to transmit information on the set volume or sound quality of the audio signal to each of the one or more audio devices; the one or more audio devices each includes: an amplification unit configured to amplify the audio signal; a control unit configured to adjust the volume or sound quality of the audio signal to be used by the amplification unit; and a reception unit configured to receive information on a setting of the volume or sound quality of the audio signal from the mobile terminal device; and the control unit is configured to control the amplification unit to adjust the volume or sound quality of the audio signal based on the information on the setting of the volume or sound quality of the audio signal received by the reception unit.

Further, according to one embodiment of the present invention, there is provided an audio device, which is configured to amplify and output an audio signal, including: an amplification unit configured to amplify the audio signal; and a control unit configured to set volume or sound quality of the audio signal to be used by the amplification unit, in which the control unit is configured to control the amplification unit to adjust the volume or sound quality of the audio signal based on information on a setting of the volume or sound quality of the audio signal received by the reception unit via a wireless network from a mobile terminal device configured to set the volume or sound quality of the audio signal based on a surrounding sound wave.

Further, according to one embodiment of the present invention, there is provided a mobile terminal device, which is configured to set volume or sound quality of an audio signal output by each of one or more audio devices via a wireless network, the mobile terminal device including: a microphone unit configured to collect a surrounding sound wave; and a transmission unit configured to set the volume or sound quality of the audio signal to be amplified by each of the one or more audio devices based on the surrounding sound wave collected by the microphone unit, and to transmit information on the set volume or sound quality of the audio signal to each of the one or more audio devices.

Further, according to one embodiment of the present invention, there is provided an audio signal control method of controlling volume or sound quality of an audio signal output from each of one or more audio devices, the audio signal control method including the steps of: detecting a level or a frequency characteristic of a surrounding sound wave collected by a microphone unit of a mobile terminal device; setting the volume or sound quality of the audio signal to be amplified by each of the one or more audio devices based on the level of frequency characteristics of the detected surrounding sound wave; and controlling information on a setting of the set volume or sound quality of the audio signal to be transmitted to each of the one or more audio devices.

Advantageous Effects of Invention

According to the present invention, it is possible to provide the audio system capable of setting the audio signal being listened to automatically to the appropriate volume or sound quality. The audio system includes the audio device configured to amplify and output the audio signal and the mobile terminal device configured to set the volume or sound quality of the audio signal output by the audio device via the wireless network.

DESCRIPTION OF EMBODIMENTS

One embodiment of the present invention is described with reference to the drawings.

Figure 1:
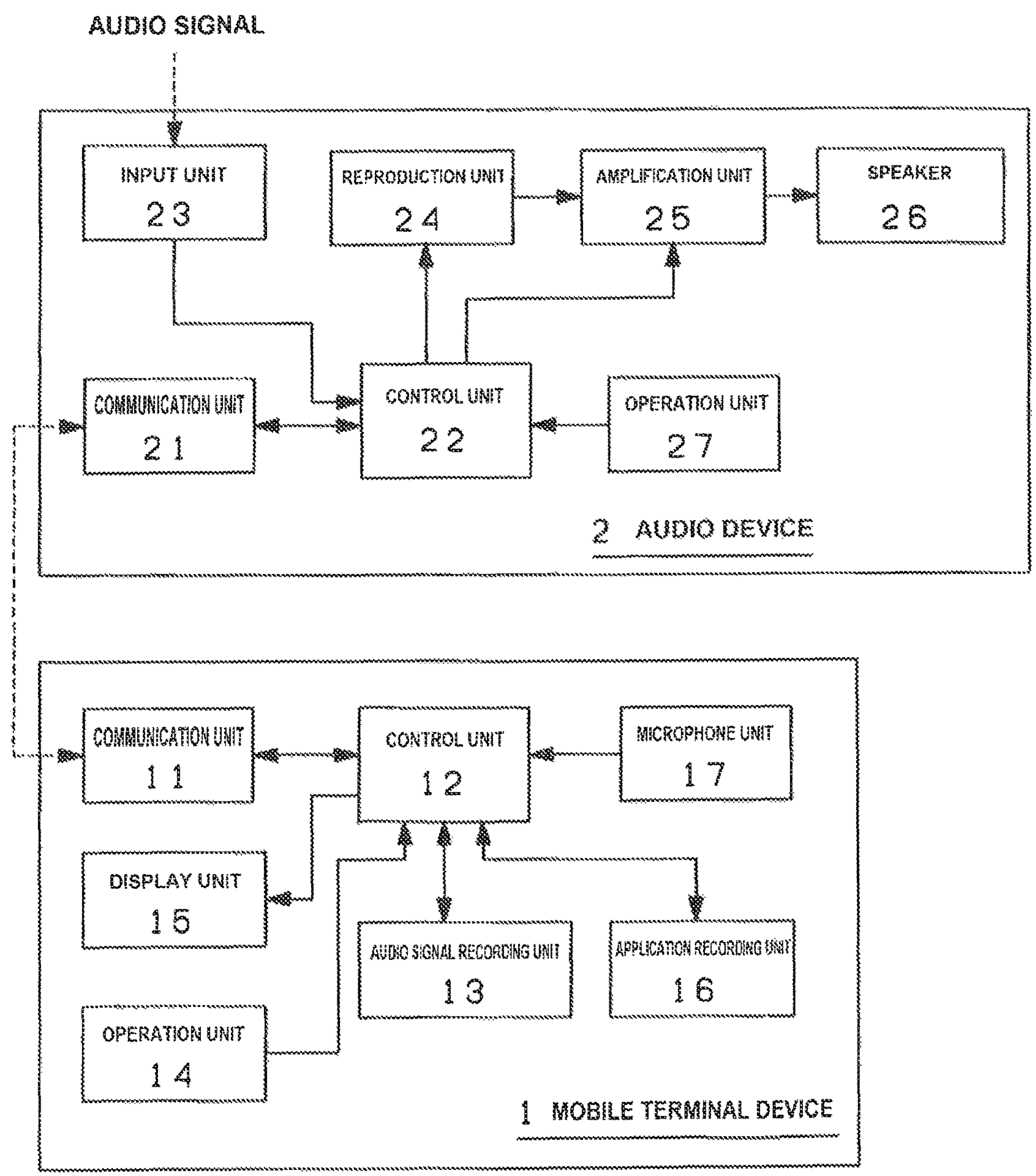
FIG. 1 is a block diagram for illustrating a configuration of an audio system according to one embodiment of the present invention.

FIG. 1 is a block diagram for illustrating a configuration of an audio system according to one embodiment of the present invention.

The audio system according to this embodiment includes an audio device and a mobile terminal device. The audio device is a general-purpose audio device configured to amplify and output an audio signal input from outside through an input terminal or in a wireless manner. The mobile terminal device is a general-purpose mobile terminal device formed of a smartphone, a portable personal computer, or the like.

First, a description is made of a configuration of a mobile terminal device 1.

As illustrated in FIG. 1, the mobile terminal device 1 includes a communication unit 11, a control unit 12, an audio signal recording unit 13, an operation unit 14, a display unit 15, and an application recording unit 16.

The communication unit 11 is configured to conduct mutual information communications to/from another device, e.g., an audio device 2, by wireless communication means, e.g., wireless fidelity (Wi-Fi). In this embodiment, the wireless communication means based on Wi-Fi is used as mutual information communication means between devices. However, as long as the information communications can be conducted between the devices, wired communication moans may be used, or any one of various wireless communication means including Bluetooth (registered trademark) and infrared communications may be used.

The control unit 12 is configured to control the entire mobile terminal device 1 including the communication unit 11, the audio signal recording unit 13, the operation unit 14, the display unit 15, and the application recording unit 16. The application recording unit 16 is configured to record application software input by communication means using the communication unit 11 or via a signal input unit (not shown).

The display unit 15 is configured to display, when the application software recorded in the application recording unit 16 is activated, each kind of key and information corresponding to the activated software. The operation unit 14 is formed of a touch panel, and is configured to detect that the key has been selected when each kind of key is touched, and to output each kind of signal to the control unit 12. The audio signal recording unit 13 is configured to record the audio signal input by the communication means using the communication unit 11 or via the signal input unit (not shown).

A microphone unit 17 is configured to collect a surrounding sound wave around the mobile terminal device 1, to convert collected sound into a sound signal, and to output the converted sound signal to the control unit 12. When the mobile terminal device 1 enables a conversation with another mobile terminal device by telephone, the control unit 12 transmits the sound signal output from the microphone unit 17 to the another mobile terminal device via the communication unit 11, and outputs the sound signal, which has been input from the another mobile terminal device via the communication unit 11, from a speaker (not shown).

Next, a description is made of a configuration of the audio device 2.

The audio device 2 includes a communication unit 21, a control unit 22, an input unit 23, a reproduction unit 24, an amplification unit 25, a speaker 26, and an operation unit 27.

The communication unit 21 is configured to conduct information communications to/from another device, e.g., the mobile terminal device 1, by the wireless communication means based on Wi-Fi or the like. For example, when receiving an audio signal from the communication unit 11 of the mobile terminal device 1 by the wireless communication means, the communication unit 21 outputs the received audio signal to the reproduction unit 24 via the control unit 22. The input unit 23 is connected to an external reproduction device, and is configured to input an audio signal output from the reproduction device, and to output the input audio signal to the reproduction unit 24 via the control unit 22.

The operation unit 27 is configured to receive various operation instructions for reproduction start, reproduction stop, volume adjustment, and sound quality adjustment, which relate to the audio signal, from a user, and to output a content of the received operation instruction to the control unit 22. The control unit 22 is configured to control the entire audio device 2 including the communication unit 21, the input unit 23, the reproduction unit 24, the amplification unit 25, and the operation unit 27. The reproduction unit 24 is configured to reproduce the audio signal input from the communication unit 21 or the input unit 23 under control of the control unit 22. The amplification unit 25 is configured to amplify the studio signal reproduced by the reproduction unit 24 with volume and sound quality that have been specified by the control unit 22, and to output the amplified audio signal to the speaker 26. The speaker 26 is configured to output the audio signal output from the simplification unit 25 as a sound wave.

Next, a description is made of a configuration employed in a case where an operation of the audio device 2 is controlled by the mobile terminal device 1 in a state illustrated in FIG. 1 in which the mobile terminal device 1 and the audio device 2 are connected to each other by the wireless communication means.

First, application software relating to the operation of the audio device 2, which is recorded in the application recording unit 16, is activated in a state in which the application software relating to the operation of the audio device 2 is recorded in the application recording unit 16 in advance. When the application software relating to the operation of the audio device 2, which is recorded in the application recording unit 16, is activated, the control unit 12 controls the display unit 15 so that the display unit 15 displays the operation key relating to the operation of the audio device 2, and controls the operation unit 14 to receive an instruction relating to the operation of the audio device 2 through the operation unit 14. When various instruction signals for the selection, the reproduction start, the reproduction stop, the change of the volume and sound quality of the audio signal, and the like, which relate to a song of the audio signal within the audio device 2, are input from the operation, unit 14 by the operation of the operation unit 14, the control unit 12 transmits the input various instruction signals to the control unit 22 of the audio device 2 via the communication unit 11 and the communication unit 21. The control unit 22 of the audio device 2 controls the reproduction unit 24 to conduct the selection, the reproduction start, and the reproduction stop, which relate to a song of the audio signal input from the communication unit 21 or the input unit 23, based on the various instructions transmitted from the control unit 12, and controls the amplification unit 25 to adjust an amplification value and sound quality of the audio signal output to the speaker 26.

As described above, with the audio system according to this embodiment, it is possible to remotely operate the selection, the reproduction start, the reproduction stop, and the adjustment of the volume and sound quality, which relate to the song of the audio signal output from the audio device 2, by operating the operation unit 14 of the mobile terminal device 1.

Figure 2:
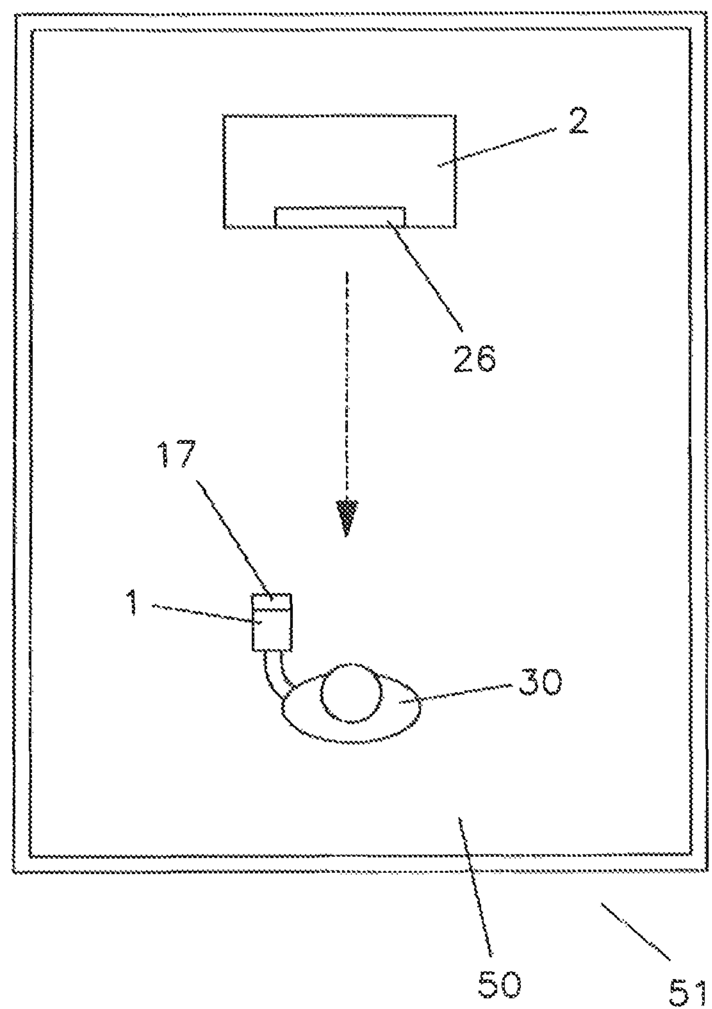
FIG. 2 is a diagram for illustrating a case where, in the audio system according to this embodiment, an audio device 2 is installed in an indoor place, and a user who exists in the same indoor place as the audio device 2 listens to an audio signal output from the audio device 2 by operating an operation unit 14 while holding a mobile terminal device 1.

FIG. 2 is a diagram for illustrating a case where, in the audio system according to this embodiment, the audio device 2 is installed in the indoor place, and the user who exists in the same indoor place as the audio device 2 listens to the audio signal output from the audio device 2 by operating the operation unit 14 while holding the mobile terminal device 1.

Figure 3:
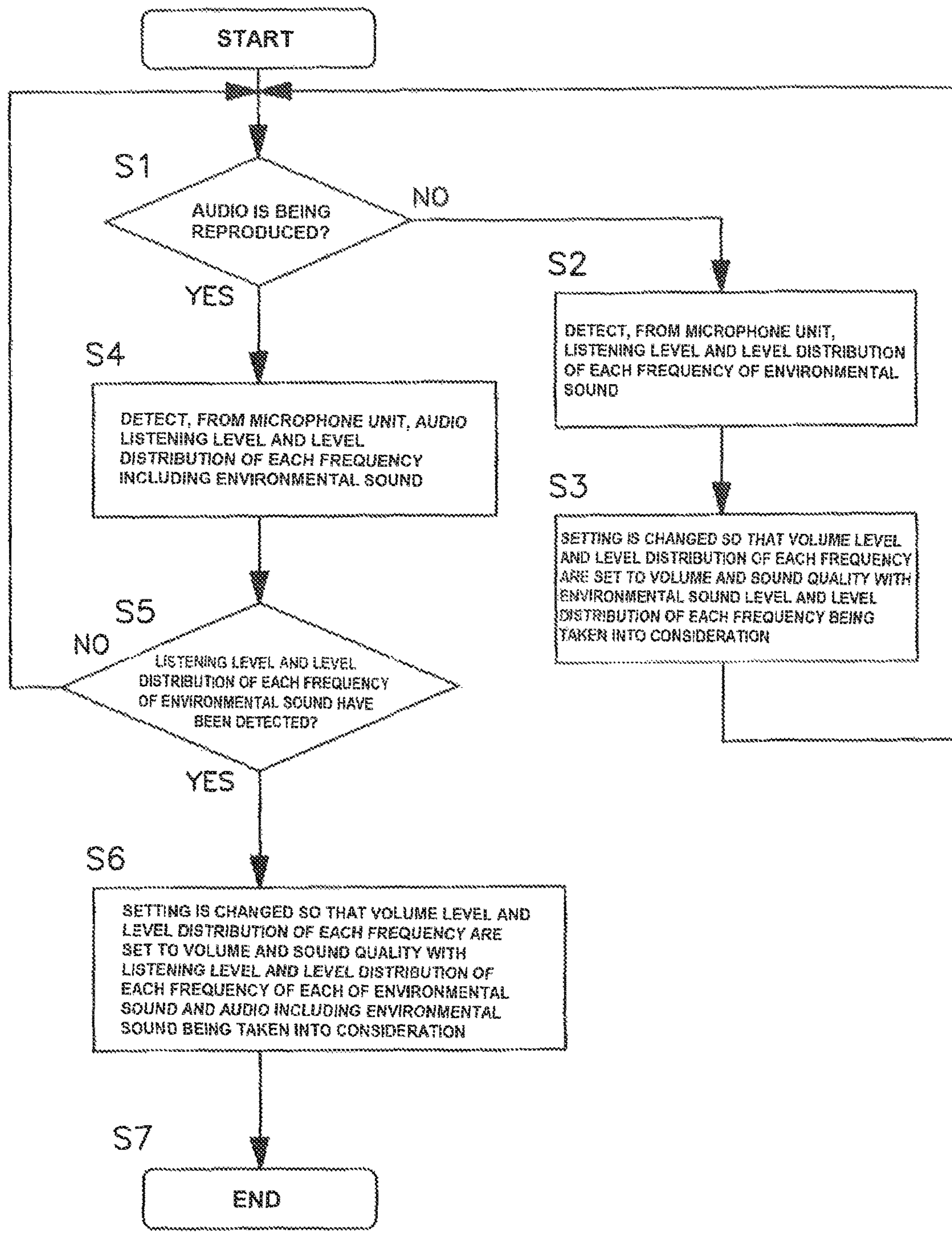
FIG. 3 is a flowchart for illustrating operations of the mobile terminal device 1 and the audio device 2 conducted in the audio system according to this embodiment when an automatic volume-and-sound quality setting with the environmental sound being taken into consideration is conducted for the audio signal output from the audio device 2 in a state in which the audio device 2 is installed in the indoor place as illustrated in FIG. 2 with the user existing in the same indoor place as the audio device 2.

FIG. 3 is a flowchart for illustrating operations of the mobile terminal device 1 and the audio device 2 conducted in the audio system according to this embodiment when an automatic volume-and-sound quality setting with the environmental sound being taken into consideration is conducted for the audio signal output from the audio device 2 in a state in which the audio device 2 is installed in the indoor place as illustrated in FIG. 2 with the user existing in the same indoor place as the audio device 2.

It is assumed in this embodiment that "application software relating to the automatic volume-and-sound quality setting with the environmental sound being taken into consideration" is recorded in advance in the application recording unit 16 of the mobile terminal device 1.

First, when the "application software relating to the automatic volume-and-sound quality setting with the environmental sound being taken into consideration" recorded in the application recording unit 16 is activated by the mobile terminal device 1, the control unit 12 accesses the control unit 22 of the audio device 2 through wireless communications based on the communication unit 11 and the communication unit 21, and determines whether or not the audio device 2 is reproducing an audio signal (Step S1). When determining in Step S1 that the audio device 2 is not reproducing an audio signal, the control unit 12 first detects an average environmental sound level exhibited around the mobile terminal device 1 during a fixed time period and a level distribution of each frequency of environmental sound based on the sound signal collected by the microphone unit 17 as a "listening level of the environmental sound" and a "level distribution of each frequency of the environmental sound", respectively (Step S2). The "level distribution of each frequency of the environmental sound" represents, for example, a level distribution of noise, which is emitted from a transportation facility or the like and concentrated on an extremely low frequency, or a level distribution of environmental sound, e.g., wind noise of a ventilating fan, which is distributed unevenly over a specific frequency or a high frequency range.

Subsequently, the control unit 12 controls the control unit 22 to set a volume level and the level distribution of each frequency (frequency characteristic) for the amplification unit 25, which have been adjusted by the control unit 22 of the audio device 2, to a "volume and sound quality with the environmental sound level and the level distribution of each frequency being taken into consideration" based on the "listening level of the environmental sound" and the "level distribution of each frequency of the environmental sound" that have been detected (Step S3).

In regard to the setting of the "volume and sound quality with the environmental sound level and the level distribution of each frequency being taken into consideration", for example, in regard to the setting of the volume, a setting change is automatically controlled so that an amplification level of the audio signal to be amplified by the amplification unit 25 has an amplification value larger than the detected "listening level of the environmental sound" by 30 dB. In this case, for example, when the "listening level of the environmental sound" is 10 dB, the control unit 12 controls the control unit 22 so that the amplification level of the audio signal to be amplified by the amplification unit 25 becomes 40 dB. When the "listening level of the environmental sound" is 30 dB, the control unit 12 controls the control unit 22 so that the amplification level of the audio signal to be amplified by the amplification unit 25 becomes 60 dB.

Meanwhile, in regard to the setting of, for example, the sound quality of the "volume and sound quality with the environmental sound level and the level distribution of each frequency being taken into consideration", when a specific frequency band exhibits a high level within the detected "level distribution of each frequency of the environmental sound", the control unit 12 controls the control unit 22 so that the output level of a frequency band high in level among frequency bands of the environmental sound increases in the audio signal to be amplified by the amplification unit 25. In this manner, by increasing the output level of the same frequency band as the band high in level among the frequency bands of the environmental sound in the audio signal being output, it is possible to prevent the audio signal from being masked by the environmental sound distributed unevenly over a specific band, and by subjecting only the band over which the environmental sound distributed unevenly to adjustment of the sound quality, e.g., the frequency characteristic, it is possible to ensure an efficient ratio of noise and listening sound with a minimum change in total volume. After the "volume and sound quality with the environmental sound level and the level distribution of each frequency being taken into consideration" are set in Step S3, the procedure returns to Step S1.

In this manner, it is possible to prevent the audio signal from becoming harder to listen to due to surrounding environmental sound by setting the "volume and sound, quality with the environmental sound level and the level distribution of each frequency being taken into consideration" in Step S3, for example, by increasing the amplification value of the audio signal in accordance with the listening level of the environmental sound when the listening level of the environmental sound is high while decreasing the amplification value of the audio signal in accordance with the listening level of the environmental sound when the listening level of the environmental sound is low. Further, when a specific frequency band exhibits a high level within the detected "level distribution of each frequency of the environmental sound", the output level of the frequency band high in level among the frequency bands of the environmental sound is increased in the audio signal to be amplified by the amplification unit 25, to thereby be able to correct a situation in which, for example, a bass sound portion of the audio signal is temporarily masked by noise exhibiting a low frequency range due to vibrations or noise when a truck or a train passes by around the house, bass sound or the like of the audio signal becomes harder to hear, and the user feels that the bass sound is lacking. Hence, the user can comfortably keep listening to music without feeling a large change in volume.

When determining in Step S1 that the audio device 2 is reproducing an audio signal, the control unit 12 first detects an average sound level exhibited around the mobile terminal device 1 during the fixed time period and a level distribution of each frequency of sound based on the sound signal collected by the microphone unit 17 as a "listening level of the audio signal including the environmental sound" and a "level distribution of each frequency including the environmental sound", respectively (Step S4). Subsequently, the control unit 12 determines whether or not the "listening level of the environmental sound" and the "level distribution of each frequency of the environmental sound" have been detected in Step S2 (Step S5), and when determining that the detection has not been finished, returns to Step S1.

When determining in Step S5 that the "listening level of the environmental sound" and the "level distribution of each frequency of the environmental sound" have been detected in Step S2, the control unit 12 controls the control unit 22 to set the volume level and the level distribution of each frequency (frequency characteristic) for the amplification unit 25, which have been adjusted by the control unit 22 of the audio device 2, to a "volume and sound quality with the listening level and the level distribution of each frequency of each of the environmental sound and the audio including the environmental sound being taken into consideration" based on the "listening level of the environmental sound", the "level distribution of each frequency of the environmental sound", the "listening level of the audio signal including the environmental sound", and the "level distribution of each frequency including the environmental sound", which have been, detected (Step S6).

In regard to the setting of the "volume and sound quality with the listening level and the level distribution of each frequency of each of the environmental sound and the audio including the environmental sound being taken into consideration", for example, in regard to the setting of the volume, the setting change is automatically controlled so that the amplification level of the audio signal to be amplified by the amplification unit 25 has an amplification value larger than the detected "listening level of the environmental sound" by 30 dB when a difference between the "listening level of the audio signal including the environmental sound" and the "listening level of the environmental sound" is larger than 25 dB while the setting change is automatically controlled so that the amplification level of the audio signal to be amplified by the amplification unit 25 has an amplification value larger than the detected "listening level of the environmental sound" by 35 dB when the difference between the "listening level of the audio signal including the environmental sound" and the "listening level of the environmental sound" is smaller than 25 dB. In this case, for example, when the difference between the "listening level of the audio signal including the environmental sound" and the "listening level of the environmental sound" is larger than 25 dB with the "listening level of the environmental sound" being 10 dB and the “listening level of the audio signal including the environmental sound” being 40 dB, the control unit 12 controls the control unit 22 so that the amplification level of the audio signal to be amplified by the amplification unit 25 becomes 40 dB being the amplification value larger than the “listening level of the environmental sound” by 30 dB. When the difference between the “listening level of the audio signal including the environmental sound” and the “listening level of the environmental sound” is smaller than 25 dB with the “listening level of the environmental sound” being 10 dB and the “listening level of the audio signal including the environmental sound” being 30 dB, the control unit 12 controls the control unit 22 so that the amplification level of the audio signal to be amplified by the amplification unit 25 becomes 45 dB being the amplification value larger than the “listening level of the environmental sound” by 35 dB.

Meanwhile, in regard to the setting of, for example, the sound quality of the “volume and sound quality with the listening level and the level distribution of each frequency of each of the environmental sound and the audio including the environmental sound being taken into consideration”, when a specific frequency band exhibits a large difference in level within the “level distribution of each frequency of the environmental sound” and the “level distribution of each frequency including the environmental sound” in the “level distribution of each frequency of the environmental sound” and the “level distribution of each frequency including the environmental sound” that have been detected, the control unit 12 controls the control unit 22 so that the output level of a frequency band exhibiting a large difference in level of a specific frequency band increases in the audio signal to be amplified by the amplification unit 25. In this manner, by increasing the output level of the same frequency band as the band exhibiting a large difference in level of a specific frequency band in the audio signal being output, it is possible to further prevent the audio signal from being masked by the environmental sound distributed unevenly over a specific band.

In this manner, it is possible to prevent the audio signal from becoming hard to listen to or sound quality from changing due to an obstruction or a distance between the audio device 2 and the user holding the mobile terminal device 1 by setting the “volume and sound quality with the listening level and the level distribution of each frequency of each of the environmental sound and the audio including the environmental sound being taken into consideration” in Step S6. For example, the above-mentioned prevention is enabled by further increasing the amplification value of the audio signal to be increased in accordance with the listening level of the environmental sound and increasing the output level of a specific frequency band exhibiting a large difference in level within the “level distribution of each frequency of the environmental sound” and the “level distribution of each frequency including the environmental sound” in a case where the difference between the “listening level of the audio signal including the environmental sound” and the “listening level of the environmental sound” is smaller than a predefined value, in short, in a case where the audio signal to reach the user is weaker than expected, even when the volume of the audio signal to reach the user is small or there is a change in sound quality because the distance between the audio device 2 and the user holding the mobile terminal device 1 is long or an obstruction exists between the audio device 2 and the user holding the mobile terminal device 1 even after the sound quality and the amplification value of the audio signal to be used by the amplification unit 25 have been changed in accordance with the listening level of the environmental sound and a frequency band-specific level distribution in Step S3.

As described above, in the audio system according to this embodiment, when the “application software relating to the automatic volume-and-sound quality setting with the environmental sound being taken into consideration” recorded in the application recording unit 15 is activated by the user holding the mobile terminal device 1, the “listening level of the environmental sound”, the “level distribution of each frequency of the environmental sound”, the “listening level of the audio signal including the environmental sound”, and the “level distribution of each frequency including the environmental sound” around the user are detected by the microphone unit 17 of the mobile terminal device 1 held by the user, to thereby be able to optimize the volume and sound quality of the audio signal to be used by the amplification unit 25. Therefore, the user does not need to manually adjust the volume and sound quality, and hence it is possible to automatically set the volume and sound quality of the audio signal output by the audio device 2 to appropriate volume and sound quality even when the installation position of the audio device 2 is changed.

Figure 4:
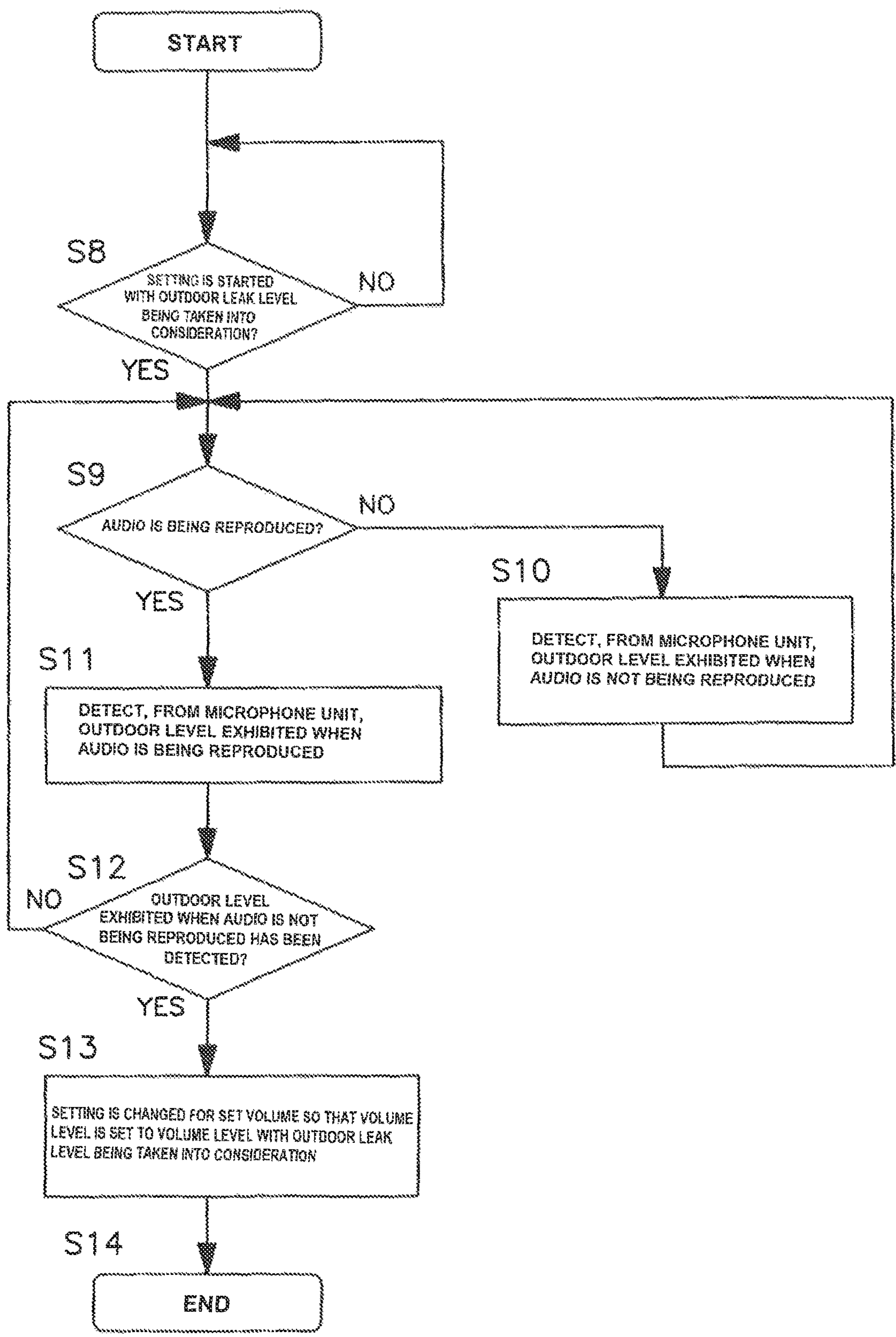
FIG. 4 is a flowchart for illustrating operations of the mobile terminal device 1 and the audio device 2 conducted in the audio system according to this embodiment when an automatic volume setting with an outdoor leak level being taken into consideration is conducted for the audio signal output from the audio device 2.

FIG. 4 is a flowchart for illustrating operations of the mobile terminal device 1 and the audio device 2 conducted in the audio system according to this embodiment when an automatic volume setting with an outdoor leak level being taken into consideration is conducted for the audio signal output from the audio device 2.

It is assumed in this embodiment that “application software relating to the automatic volume setting with the outdoor leak level being taken into consideration” is recorded in advance in the application recording unit 16 of the mobile terminal device 1.

First, in a state in which a user 30 holding the mobile terminal device 1 has moved to an outdoor place 51 after such a state as illustrated in FIG. 2 in which the user 30 exists in an indoor place 50 where the audio device 2 is installed, when the “application software relating to the automatic volume setting with the outdoor leak level being taken into consideration” recorded in the application recording unit 16 is activated by the mobile terminal device 1 (Step S8), the control unit 12 accesses the control unit 22 of the audio device 2 through the wireless communications based on the communication unit 11 and the communication unit 21, and determines whether or not the audio device 2 is reproducing an audio signal (Step S9). When determining in Step S9 that the audio device 2 is not reproducing an audio signal, the control unit 12 first detects the average environmental sound level exhibited around the mobile terminal device 1 during the fixed time period based on the sound signal collected by the microphone unit 17 as an “outdoor level exhibited when the audio is not being reproduced” (Step S10), and returns to Step S9.

When determining in Step S9 that the audio device 2 is reproducing an audio signal, the control unit 12 first detects the average environmental sound level exhibited around the mobile terminal device 1 during the fixed time period based on the sound signal collected by the microphone unit 17 as an “outdoor level exhibited when the audio is being reproduced” (Step S11). Subsequently, the control unit 12 determines whether or not the “outdoor level exhibited when the audio is not being reproduced” has been detected in Step S10 (Step S12), and when determining that the detection has not been finished, returns to Step S9.

When determining in Step S12 that the “outdoor level exhibited when the audio is not being reproduced” has been detected in Step S10, the control unit 12 controls the control unit 22 to set the volume level for the amplification unit 25, which has been adjusted by the control unit 22 of the audio device 2, to a "volume level with the outdoor leak level being taken into consideration" based on the "outdoor level exhibited when the audio is not being reproduced" and the "outdoor level exhibited when the audio is being reproduced", which have been detected (Step S13). In regard to the setting of the "volume level with the outdoor leak level being taken into consideration", for example, the set amplification value for the amplification unit 25 is maintained when a difference between the "outdoor level exhibited when the audio is not being reproduced" and the "outdoor level exhibited when the audio is being reproduced" is smaller than 10 dB, while the setting change is automatically controlled for the amplification level of the audio signal to be amplified by the amplification unit 25 so that the difference between the "outdoor level exhibited when the audio is not being reproduced" and the "outdoor level exhibited when the audio is being reproduced" becomes smaller than 10 dB when the difference is larger than 10 dB. In this case, for example, when the difference is smaller than 10 dB with the "outdoor level exhibited when the audio is not being reproduced" being 10 dB and the "outdoor level exhibited when the audio is being reproduced" being 18 dB, the control unit 12 maintains the set amplification value for the amplification unit 25. When the difference is larger than 10 dB with the "outdoor level exhibited when the audio is not being reproduced" being 10 dB and the "outdoor level exhibited when the audio is being reproduced" being 30 dB, the control unit 12 automatically controls the setting change for the amplification level of the audio signal to be amplified by the amplification unit 25 so that the difference becomes smaller than 10 dB.

In this manner, the volume of the audio signal is adjusted by setting the "volume level with the outdoor leak level being taken into consideration" in Step S13 so that, for example, when the audio signal output indoors leaks out outdoors at high volume to cause the difference between the outdoor environmental sound level exhibited with no audio signal being reproduced and the outdoor environmental sound level exhibited when the audio signal is being reproduced indoors to become larger than 10 dB, the difference between the outdoor environmental sound level exhibited with no audio signal being reproduced and the outdoor environmental sound level exhibited when the audio signal is being reproduced indoors becomes smaller than 10 dB, to thereby be able to prevent the audio signal at high volume from leaking outdoors from the room as noise to trouble the neighbors.

As described above, in the audio system according to this embodiment, when the "application software relating to the automatic volume setting with the outdoor leak level being taken into consideration" recorded in the application recording unit 16 is activated by the user holding the mobile terminal device 1, the "outdoor level exhibited when the audio is not being reproduced" and the "outdoor level exhibited when the audio is being reproduced" are detected, and the amplification value of the audio signal to be used by the amplification unit 25 is automatically adjusted to a volume level that does not trouble the neighborhood outdoors, to thereby allow the volume to become as appropriate as to prevent noise from troubling the neighborhood.

In the audio system according to this embodiment, the environmental sound and an output of the audio signal are measured by a general-purpose mobile terminal device formed of a smart phone, a portable personal computer, or the like. Therefore, there is no need to prepare a microphone for measurement, which is necessary for the measurement of acoustics, and the environmental sound and the output of the audio signal can be measured easily by the user carrying around the mobile terminal device 1. Hence, the configuration of this embodiment can be easily achieved at low cost.

The audio system according to this embodiment is configured to conduct the two automatic volume settings including the automatic volume-and-sound quality setting with the environmental sound being taken into consideration, which is described with reference to FIG. 3, and the automatic volume setting with the outdoor leak level being taken into consideration, which is described with reference to FIG. 4. However, the audio system may be configured to conduct only any one of the automatic settings, or may be configured to conduct other automatic settings corresponding to various surrounding environments. For example, the audio system may be configured to measure a change in listening level of the audio signal output from the audio device 2 for each fixed time period by the microphone unit 17 of the mobile terminal device 1 in a case where the user's position or orientation is changed when the user is enjoying the audio signal output from the audio device 2 with the mobile terminal device 1 being held while, for example, dancing in front of the audio device 2, and to change the amplification value of the audio signal to be used by the amplification unit 25 in accordance with the measured change in listening level. This allows the user to comfortably enjoy the audio signal without having trouble to listen to the audio signal output from the audio device 2 even when the user's position or orientation is changed.

The audio system according to this embodiment is configured to detect the "listening level of the environmental sound", the "level distribution of each frequency of the environmental sound", the "listening level of the audio signal including the environmental sound", and the "level distribution of each frequency including the environmental sound" in the automatic volume-and-sound quality setting with the environmental sound being taken into consideration, which is described with reference to FIG. 3, and to automatically set the volume and sound quality of the audio signal output from the audio device 2. However, for example, the audio system may be configured to detect only the "listening level of the environmental sound" and the "listening level of the audio signal including the environmental sound", and to automatically set only the volume of the audio signal output from the audio device 2. The audio system may also be configured to detect only the "level distribution of each frequency of the environmental sound" or the "level distribution of each frequency including the environmental sound", and to automatically set only the sound quality of the audio signal output from the audio device 2.

The audio system according to this embodiment is configured to conduct the two automatic volume settings including the automatic volume-and-sound quality setting with the environmental sound being taken into consideration, which is described with reference to FIG. 3, and the automatic volume setting with the outdoor leak level being taken into consideration, which is described with reference to FIG. 4. However, the audio system is not limited to such a configuration for the automatic settings, and may be applied to a case where, for example, a plurality of audio devices are installed on the periphery of the room, and the user listens to a multi-channel surround sound audio signal output from speakers of the plurality of audio devices. In such a case, the audio system may also be configured to: calculate, by the microphone unit 17 of the mobile terminal device 1, the volume level of the audio signal output from the speaker of each audio device and a time period required until the audio signal reaches; detect the volume level of the audio signal output from each audio device and a delay time of the audio signal output from each audio device based on the calculated values through use of an algorithm, for example, a least-squares method; and automatically set a correction value. With this configuration, when a multi-channel surround sound audio signal is listened to through use of a plurality of audio devices, it is possible to conduct, without bothering to prepare a microphone for measuring a sound field, such a setting as to automatically correct the volume level of the audio signal output from the speaker of each audio device and the delay time required until the audio signal output from the speaker of each audio device reaches the user.

The audio system according to this embodiment is not limited to one audio device 2 as illustrated in FIG. 2. For example, the audio system may be configured so that two audio devices are installed on the periphery of the room, and configured to detect all surrounding environments by the microphone unit 17 of the mobile terminal device 1, and to automatically set the sound quality or volume of a stereo audio signal output by the speakers of the two audio devices. The audio system may also be configured so that two or three or more audio devices are installed on the periphery of the room, and configured to automatically set the sound quality or the volume of a monaural audio signal output from each of the speakers of the two or three or more audio devices or an individual audio signal output from each of the speakers of the two or three or more audio devices.

The audio system according to this embodiment is configured to detect the "listening level of the environmental sound", the "level distribution of each frequency of the environmental sound", the "listening level of the audio signal including the environmental sound", and the "level distribution of each frequency including the environmental sound" when the automatic volume-and-sound quality setting with the environmental sound being taken into consideration is conducted, and to detect the "outdoor level exhibited when the audio is not being reproduced" and the "outdoor level exhibited when the audio is being reproduced" when the automatic volume setting with the outdoor leak level being taken into consideration is conducted. However, the audio system is not limited to those detections, and may be configured to detect any kind of volume or frequency band, for example, detect all listening levels or a level distribution of only a specific frequency range band.

The audio system according to this embodiment is configured to record the "application software relating to the automatic volume-and-sound quality setting with the environmental sound being taken into consideration" and the "application software relating to the automatic volume setting with the outdoor leak level being taken into consideration" in the application recording unit 16 of the mobile terminal device 1. However, for example, the audio system may be configured to record those pieces of application software on the audio device 2, and to cause the audio device 2 to adjust the volume and sound quality based on a result of measuring the acoustics by the mobile terminal device 1. The audio system may also be configured to control the volume and sound quality by reading software recorded in advance in another device that can conduct information communications to/from the mobile terminal device 1 or the audio device 2.

The audio system according to this embodiment is configured so that the application software is activated by the user when the automatic volume-and-sound quality setting with the environmental sound being taken into consideration and the automatic volume setting with the outdoor leak level being taken into consideration are conducted. However, the user does not need to activate the application software. For example, the audio system may be configured to discriminate whether the user holding the mobile terminal device 1 exists indoors or outdoors by a global positioning system (GPS) or the like included in the mobile terminal device 1, and to automatically activate the application software based on a result of the discrimination to control the volume and sound quality of the audio signal.

The audio system according to this embodiment is configured so that the mobile terminal device 1 and the audio device 2 conduct the information communications to/from each other by the wireless communication means based on Wi-Fi. However, in addition to the wireless communication means based on Wi-Fi, the audio system may employ various wireless or wired information communication means including Bluetooth (registered trademark), infrared communications, and a high-definition multimedia interface (HDMI (registered trademark)).

INDUSTRIAL APPLICABILITY

The present invention can be used for: an audio system including an audio device configured to amplify and output an audio signal and a mobile terminal device configured to set volume or sound quality of the audio signal output by the audio device via a wireless network; an audio device; a mobile terminal device; and an audio signal control method, in a useful manner.

REFERENCE SIGNS LIST

1 mobile terminal device, 11 communication unit, 12 control unit, 13 audio signal recording unit, 14 operation unit, 15 display unit, 16 application recording unit, 17 microphone unit, 2 audio device, 21 communication unit, 22 control unit, 23 input, unit, 24 reproduction unit, 25 amplification unit, 26 speaker, 27 operation unit, 30 user, 50 indoor place, 51 outdoor place

The invention claimed is:

1. An audio system, comprising:

one or more audio devices each configured to amplify and output an audio signal; and a mobile terminal device configured to set volume or sound quality of the audio signal output by each of the one or more audio devices via a wireless network, wherein the mobile terminal device comprises:

a microphone unit configured to collect an environmental sound;

a mobile terminal device control unit configured to receive the collected environmental sound and detect a sound level and a level frequency distribution of the environmental sound; and a transmission unit configured to set volume or sound quality of the audio signal to be amplified by each of the one or more audio devices based on the sound level and the level frequency distribution of the environmental sound, and to transmit information on the set volume or sound quality of the audio signal to each of the one or more audio devices;

the one or more audio devices each comprises:

an amplification unit configured to amplify the audio signal;

an audio device control unit configured to adjust the volume or sound quality of the audio signal to be used by the amplification unit; and a reception unit configured to receive information on a setting of the volume or sound quality of the audio signal from the mobile terminal device; and the audio device control unit is configured to control the amplification unit to adjust a volume level and the level distribution of each frequency of the audio signal based on the information on the setting of the volume or sound quality of the audio signal received by the reception unit.

2. A mobile terminal device, which is configured to set volume or sound quality of an audio signal output by each of one or more audio devices via a wireless network, the mobile terminal device comprising:

a microphone unit configured to collect an environmental sound;

a mobile terminal device control unit configured to receive the collected environmental sound and detect a sound level and a level frequency distribution of the environmental sound; and a transmission unit configured to set volume or sound quality of the audio signal to be amplified by each of the one or more audio devices based on the sound level and the level frequency distribution of the environmental sound, and to transmit information on the set volume or sound quality of the audio signal to each of the one or more audio devices.

* * * * *